(12) United States Patent
Hynecek et al.

(10) Patent No.: US 10,186,535 B2
(45) Date of Patent: Jan. 22, 2019

(54) IMAGE SENSORS WITH STACKED PHOTODIODES

(71) Applicant: SEMICONDUCTOR COMPONENTS INDUSTRIES, LLC, Phoenix, AZ (US)

(72) Inventors: Jaroslav Hynecek, Allen, TX (US); Vladimir Korobov, San Mateo, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 64 days.

(21) Appl. No.: 15/269,525

(22) Filed: Sep. 19, 2016

(65) Prior Publication Data

US 2018/0084164 A1  Mar. 22, 2018

(51) Int. Cl.
*H04N 5/225* (2006.01)
*H04N 5/378* (2011.01)
(Continued)

(52) U.S. Cl.
CPC .. *H01L 27/14612* (2013.01); *H01L 27/14621* (2013.01); *H01L 27/14632* (2013.01); *H01L 27/14636* (2013.01); *H01L 27/14641* (2013.01); *H01L 27/14647* (2013.01); *H01L 27/14687* (2013.01); *H04N 5/379* (2018.08); *H04N 5/37452* (2013.01); *H04N 9/045* (2013.01); *H01L 27/1463* (2013.01); *H04N 5/359* (2013.01); *H04N 5/3575* (2013.01); *H04N 5/35509* (2013.01)

(58) Field of Classification Search
CPC ........ H04N 5/2253; H04N 5/378; H04N 9/04; H04N 3/155; H04N 5/335; H01L 27/14643; H01L 27/14609; H01L 27/14603
See application file for complete search history.

(56) References Cited

U.S. PATENT DOCUMENTS 7,316,930 B1    1/2008  Montalbo
2009/0194799 A1*  8/2009  Lee .................. H01L 27/14647
                                                      257/292

(Continued)

*Primary Examiner* — Twyler L Haskins
*Assistant Examiner* — Carramah J Quiett
(74) *Attorney, Agent, or Firm* — Treyz Law Group, P.C.; Joseph F. Guihan

(57) ABSTRACT

Electronic devices may include High Dynamic Range (HDR) complementary metal-oxide-semiconductor (CMOS) image sensor arrays that are illuminated from the back side of the substrate and operate in a rolling shutter (RS) scanning mode. An image sensor may include stacked chips to improve image sensor performance. For example, by stacking photodiodes on top of each other and using dichroic dielectric layers in chip-to-chip isolation, sensor sensitivity may be increased, Moiré effect may be reduced, and the overall image sensor performance may be improved. Image sensors may include a charge sensing and charge storing scheme where charge generated by low incident light levels is transferred onto a charge sensing node of an in-pixel inverting feedback amplifier and charge generated by high incident light levels overflows a certain potential barrier built in the pixel, is stored on capacitors, and is sensed by a source follower.

21 Claims, 6 Drawing Sheets

(51) Int. Cl.
- *H04N 9/04* (2006.01)
- *H01L 27/146* (2006.01)
- *H04N 5/3745* (2011.01)
- *H04N 5/369* (2011.01)
- *H04N 5/355* (2011.01)
- *H04N 5/357* (2011.01)
- *H04N 5/359* (2011.01)

(56) References Cited

U.S. PATENT DOCUMENTS

| | | |
|---|---|---|
| 2011/0072409 A1 | 3/2011 | Gambino et al. |
| 2013/0075607 A1* | 3/2013 | Bikumandla ..... H01L 27/14632 250/332 |
| 2014/0263972 A1 | 9/2014 | Chua et al. |
| 2015/0187844 A1* | 7/2015 | Lee ................. H04N 5/378 250/208.1 |
| 2018/0213205 A1* | 7/2018 | Oh ................... H01L 27/14634 |

* cited by examiner

IMAGE SENSORS WITH STACKED PHOTODIODES

BACKGROUND

This relates generally to imaging systems and, more particularly, to imaging systems with high dynamic range.

Modern electronic devices such as cellular telephones, cameras, and computers often use digital image sensors. Image sensors (sometimes referred to as imagers) may be formed from a two-dimensional array of image sensing pixels. Each pixel includes a photosensitive element that receives incident photons (light) and converts the photons into electrical signals. Image sensors are sometimes designed to provide images to electronic devices using a Joint Photographic Experts Group (JPEG) format.

Some conventional image sensors may be able to operate in a high dynamic range (HDR) mode. HDR operation is usually accomplished in image sensors by assigning alternate rows of pixels different integration times. However, conventional image sensors may sometimes experience lower than desired resolution, lower than desired sensitivity, high Moiré artifacts, high noise levels, low pixel aperture efficiency, and low quantum efficiency.

It would therefore be desirable to be able to provide improved high dynamic range operation in image sensors.

DETAILED DESCRIPTION

The following relates to solid-state image sensor arrays that may be included in electronic devices. Specifically, electronic devices may include High Dynamic Range (HDR) complementary metal-oxide-semiconductor (CMOS) image sensor arrays that are illuminated from the back side of the substrate and operate in a rolling shutter (RS) scanning mode. An image sensor may include stacked chips to improve image sensor performance. For example, by stacking photodiodes on top of each other, sensor sensitivity may be increased, Moiré effect may be reduced, and the overall image sensor performance may be improved.

In order to improve image sensor performance, image sensors may include a charge sensing and charge storing scheme where charge generated by low incident light levels is transferred onto a charge sensing node of an in-pixel inverting feedback amplifier and charge generated by high incident light levels overflows a certain potential barrier built in the pixel, is stored on capacitors, and resulting voltage is sensed by a source follower. To implement this concept, an image sensor may include two or more chips (e.g., an upper chip, a middle chip, and a lower chip). An image sensor of this type may result in sensors that have high quantum efficiency, low dark current, low noise, high dynamic range, low Moiré effect, and small pixel size.

The following embodiments show an HDR sensor design that can operate in a rolling shutter (RS) scanning mode using charge overflow integration and storage implemented on pixel capacitors. The charge overflow structure may be added to pixel photodiodes to allow collecting and storing of charge generated in the pixel photodiodes. Charge for the low light level illuminations may be transferred onto floating diffusion (FD) nodes where it is sensed and read out with a low noise correlated double sampling (CDS) kTC-reset noise suppression technique after amplification by an in-pixel signal inverting feedback amplifier. The high light level illumination overflow charge may be integrated and stored on pixel capacitors, with two capacitors located on the top chip and one capacitor located on the middle chip. The signals from the capacitors may be sensed using a source follower (SF) circuit on the middle chip. The pixels, two of which are back side illuminated, thus have large aperture efficiency, large quantum efficiency, and low dark current with low noise. The resulting sensor array with the rolling shutter scanning mode of operation has high resolution, low Moiré artifacts, and HDR performance, which are maintained for a large range of illumination levels exceeding 100 dB s.

Figure 1:
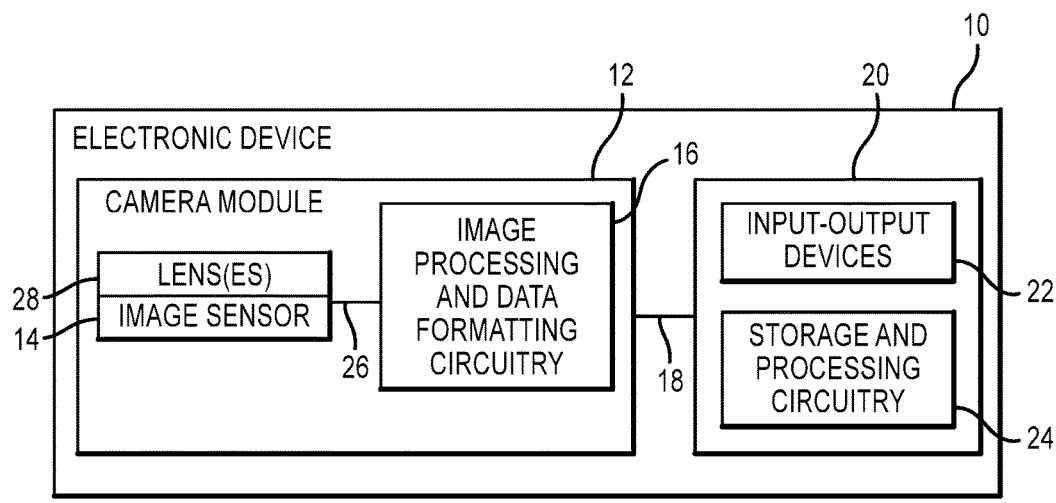
FIG. 1 is a schematic diagram of an illustrative electronic device with an image sensor in accordance with an embodiment of the present invention.

An electronic device with a digital camera module and an image sensor is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into analog signals that are later converted to digital data. Image sensors may have any number of pixels (e.g., hundreds, thousands, millions, or more). A typical image sensor may, for example, have millions of pixels (e.g., megapixels). As examples, image sensor 14 may include bias circuitry signal buffering circuits (e.g., source follower and load circuits), sample and hold circuitry, correlated double sampling (CDS) circuitry, amplifier circuitry, analog-to-digital (ADC) converter circuitry, data output circuitry, memory (e.g., data buffering circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit chip. The use of a single integrated circuit chip to implement camera sensor 14 and image processing and data formatting circuitry 16 can help to reduce costs. This is, however, merely illustrative. If desired, camera sensor 14 and image processing and data formatting circuitry 16 may be implemented using separate integrated circuit chips.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
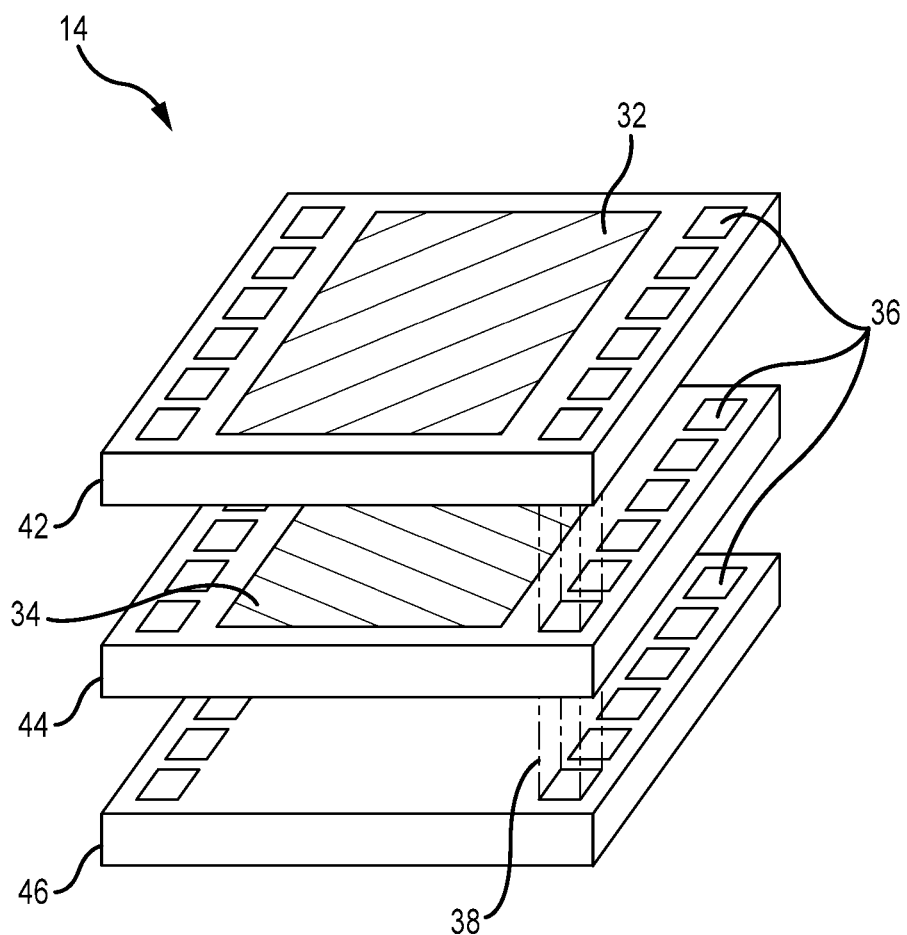
FIG. 2 is a perspective view of an illustrative image sensor with multiple chips and a hybrid bond between the upper chip and middle chip in accordance with an embodiment of the present invention.

An illustrative image sensor such as image sensor 14 in FIG. 1 is shown in FIG. 2. Image sensor 14 may sense light by converting impinging photons into electrons or holes that are integrated (collected) in sensor pixels. After completion of an integration cycle, collected charge may be converted into a voltage, which may be supplied to the output terminals of the sensor. In CMOS image sensors, the charge to voltage conversions are accomplished directly in the pixels themselves and the analog pixel voltage is transferred to the output terminals through various pixel addressing and scanning schemes. The analog signal may also be converted on-chip to a digital equivalent before reaching the chip output. The pixels may include a buffer amplifier such as a Source Follower (SF) which drives the sense lines that are connected to pixels by suitable addressing transistors. After charge to voltage conversion is completed and the resulting signal is transferred out from the pixels, the pixels may be reset in order to be ready to accumulate new charge. Some pixels may use a Floating Diffusion (FD) as a charge detection node. In these pixels, the reset may be accomplished by turning on a reset transistor that conductively connects the FD node to a voltage reference. In some embodiments, the voltage reference for the FD node may also be the pixel SF drain node. This step removes collected charge from the floating diffusion. However, it also generates kTC reset noise. This kTC reset noise may be removed from the signal using Correlated Double Sampling (CDS) signal processing in order to reduce noise in the sensor. CMOS image sensors that utilize correlated double sampling may use three (3T) or four transistors (4T) in the pixel, one of which serves as the charge transferring (TX) transistor.

Image sensor 14 may be formed with one or more substrate layers. The substrate layers may be layers of semiconductor material such as silicon. The substrate layers may be connected using metal interconnects. An example is shown in FIG. 2 in which substrates 42, 44, and 46 are used to form image sensor 14. Substrates 42, 44 and 46 may sometimes be referred to as chips. Upper chip 42 may contain pinned photodiodes in pixel array 32. Charge transferring transistor gates may also be included in upper chip 42. To ensure that there is adequate room for the photodiodes in upper chip 42, much of the pixel circuitry for the pixels may be formed in middle chip 44 and lower chip 46. However, middle chip 44 may also include photodiodes for the pixel array.

Middle chip 44 may be bonded to upper chip 42 with an interconnect layer at every pixel or an interconnect for a group of pixels (e.g., two pixels, three pixels, more than three pixels, etc.). Bonding each pixel in upper chip 42 to corresponding pixel circuitry in middle chip 44 (e.g., floating diffusion to floating diffusion) may be referred to as hybrid bonding. Middle chip 44 and lower chip 46 may not be coupled with hybrid bonding. Only peripheral electrical contact pads 36 of each chip may be bonded together (e.g., chip-to-chip connections 38). Each chip in image sensor 14 may include relevant circuitry. The upper chip may contain pinned photodiodes and charge transferring transistor gates. The middle chip may include additional photodiodes and pixel circuitry (e.g., floating diffusion node, source follower transistor, reset transistor etc.). The bottom chip may include one or more of clock generating circuits, pixel addressing circuits, signal processing circuits such as the CDS circuits, analog to digital converter circuits, digital image processing circuits, and system interface circuits.

Image sensor 14 may include capacitors for storing high light level generated charge for achieving high dynamic range (HDR) performance on middle chip 44 or lower chip 46. In addition, instead of including all of the photodiodes for image sensor 14 in upper chip 42, some photodiodes may be included in upper chip 42 while other photodiodes may be included in middle chip 44. For example, photodiodes that are designed to sense red or near infrared light may be moved onto middle chip 44, which transforms the typical array of 2×2 color sensing pixels with a Bayer color filter into a 1×2 color sensing pixel array. This may result in a more compact pixel arrangement with less Moiré artifacts. It is thus possible to use larger pixels that have higher light sensitivity in the image sensor without increasing the sensor size or decreasing the number of pixels on the sensor. This is advantageous for sensing low light level signals.

Figure 3:
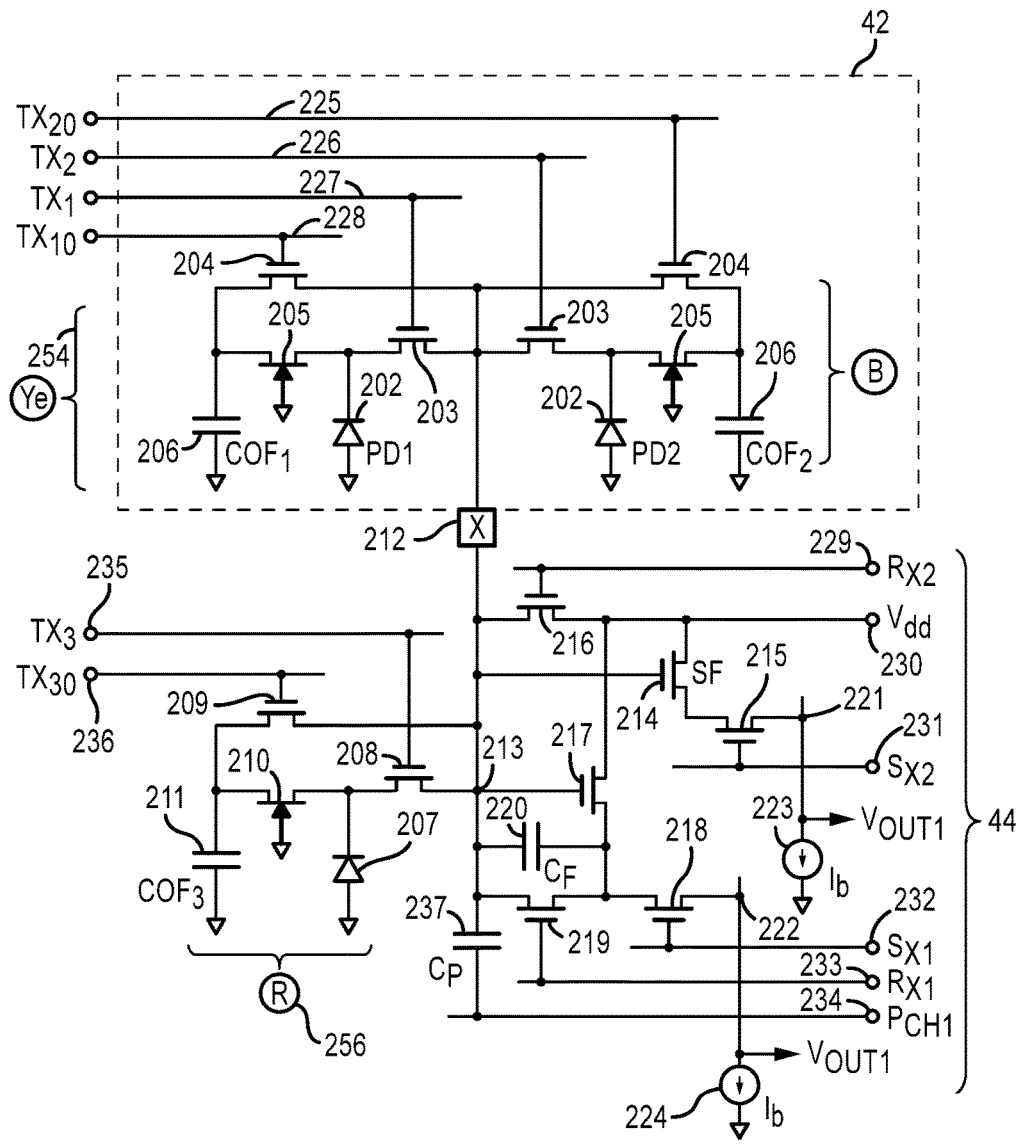
FIG. 3 is a simplified circuit diagram of an illustrative group of imaging pixels in a 1×2 pattern with photodiodes formed on an upper chip and photodiodes and readout circuitry formed on a middle chip in accordance with an embodiment of the present invention.

The simplified circuit diagram of an illustrative imaging pixel for an image sensor is shown in FIG. 3. FIG. 3 shows pixel circuits located on upper chip 42. Upper chip 42 may include pinned photodiodes 202 (PD1 and PD2). Upper chip 42 may also include low light level generated signal charge transferring transistors 203 and high light level generated signal charge overflow transistors 205. Low light level generated signal charge transferring transistors 203 may be configured to transfer charge from a respective photodiode 202 to amplifier input node 213. High light level generated signal charge overflow transistors 205 may transfer charge to charge integrating capacitors 206 ($C_{of1}$ and $C_{of2}$). High light level signal charge overflow transistors 205 may be junction gate field-effect (JFET) transistors with various ion implants placed under their gates to establish a charge overflow barrier. When the photodiodes accumulate charge that exceeds the charge overflow barrier, the charge from the photodiode will be transferred to the overflow charge integrating capacitors through transistors 205. High light level generated signal switching transistors 204 may also be included to transfer charge from capacitors 206 (sometimes referred to as storage capacitors) to middle chip 44 for sensing with source follower transistor 214.

The control signals to upper chip 42 may be distributed through row lines 225, 226, 227, and 228 ($TX_{20}$, $TX_2$, $TX_1$, and $TX_{10}$ respectively). The electrical connection of signals that is transferred from upper chip 42 to the underlying chip is made through the bump contact 212. Bump contact 212 may sometimes be referred to as a chip-to-chip interconnect layer. Interconnect layer 212 may be formed from a conductive material such as metal (e.g., copper). In certain embodiments, the interconnect layer may include solder. The interconnect layer may also be a through silicon via (TSV). The signal outputs from the pixels in the upper chip are further connected to the amplifier input node 213 via the transistors 203 and 204. For simplicity, the ground contact and the ground bias to upper chip 42 are not shown in FIG. 3. The pixels in upper chip 42 may have any desired color filter. For example, some pixels may have a blue color filter while other pixels may have a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. In FIG. 3, a blue pixel 252 is labeled "B" while a yellow pixel 254 is labeled "Ye." Blue pixel 252 may have a blue light sensing photodiode PD2 while yellow pixel 254 may have a yellow light sensing photodiode PD1. The blue pixel and the yellow pixel may also include micro lenses on their respective color filters, and the blue and yellow pixels may be back-side illuminated.

In FIG. 3, photodiodes 202 are n-type buried diodes and the charge transfer transistors 203 and the charge overflow transistors 204 are both n-channel transistors. However, this example is merely illustrative. It is also possible to design upper chip 42 to collect photon generated holes and the corresponding transistors to be the p-channel type. This may be advantageous in some applications, since the photodiodes for the collection of holes may have higher charge storage capacity than photodiodes for the collection of electrons.

As shown in FIG. 3, middle chip 44 may also include a photodiode. Photodiode 207 in middle chip 44 may be a photodiode for red light, near infrared light, or any other desired type of light. In FIG. 3, photodiode 207 is used to collect red light for red pixel 256, which is labeled "R". The red light detection pixel may be front side illuminated and includes photodiode 207, charge transferring transistor 208, overflow JFET transistor 210, high light level generated signal switching transistor 209, and charge overflow integrating capacitor 211. Similar to the blue and yellow pixels shown in upper chip 42, charge transferring transistor 208 of the red pixel may transfer charge from photodiode 207 to amplifier input node 213. Charge that exceeds the overflow charge barrier of JFET transistor 210 may be transferred to capacitor 211 ($C_{of3}$). Transistor 209 may be used to sense voltage on capacitor 211 to be sensed by source follower 214. For simplicity, the ground contact and the ground bias connection are not shown in FIG. 3. The control signals to this pixel are distributed through row lines 235 and 236 ($TX_3$ and $TX_{30}$ respectively). The signal output from this pixel is connected to the amplifier input node 213 via the transistors 208 and 209.

Signal processing circuitry may be located on middle chip 44. The signal processing circuits may be placed in an approximately pixel size (or smaller) block under blue light detecting pixel 252 and may include source follower transistor 214 (SF). Source follower transistor 214 may have a gate connected to amplifier input node 213, which may be connected to the chip-to-chip connecting bump 212. The source follower transistor signal output may be addressed by row addressing transistor 215, whereas input node 213 may be reset by reset transistor 216. The control signals to these transistors are distributed through the row lines 229 and 231 ($R_{x2}$ and $S_{x2}$ respectively). A transistor drain bias voltage (Vdd) may be supplied to the circuit through column bias line 230. Row addressing transistor 215 may have its output connected to the signal column line 221 that is biased by a constant current source 223. The pixel output from the high light level generated signal ($V_{out2}$) appears on the column line 221 and may be processed by column CDS circuits located at the periphery of middle chip 44 or on lower chip 46.

The circuit block located under blue light detecting pixel 252 may also contain low light level signal processing circuitry. This circuitry may include a transistor 217 that serves as an inverting amplifier. Transistor 217 may be a p-channel transistor. Gain controlling feedback capacitor 220 ($C_f$) may be connected between input node 213 and the drain of transistor 217. The circuitry may also include reset transistor 219. The signal output from this amplifier may be connected to the signal column line 222 by a row addressing transistor 218 and the column sense line may be biased by a current source 224. The output ($V_{OUT1}$) from the low light level generated signal, which appears on this column line, may also be processed by CDS circuits located at the periphery of middle chip 44 or CDS circuits on lower chip 46. The control signals to this circuit may be distributed through row lines 232 and 233 ($S_{x1}$ and $R_{x1}$ respectively). The circuit may also require a pre-charge step pulse that is supplied to it through capacitor 237 ($C_P$) and the pre-charge row line 234 ($P_{ch1}$).

The operation of these circuits is easily understandable from the described circuit diagram. To sense low light level signals, transistors 203 and 208 may be sequentially turned on and off after a charge integration period. The signals may be sensed and amplified by the feedback amplifier formed by transistor 217, which is biased by current source 224 and reset by the transistor 219 to implement the CDS signal processing scheme. One of the advantages of using the negative feedback amplifier with a gain is that the amplifier gain is mostly determined by the value of the feedback capacitance (Cf) 220 and the degrading effect of the parasitic capacitance of the bump chip-to-chip connection is small and can be neglected. This is important for maintaining the sensor pixel-to-pixel light sensing uniformity. For the high light level generated signals, activated when the transistors 204 and 209 are sequentially turned on and off, this is not a problem because the overflow charge capacitors 206 and 211 substantially dominate the parasitic capacitance of the bump connection and the source follower charge detection scheme can thus be used. The CDS signal processing scheme is, however, also used for these signals for the purpose of eliminating the pixel-to-pixel transistor threshold variations and thus maintaining the high sensor signal detection uniformity.

Figure 4:
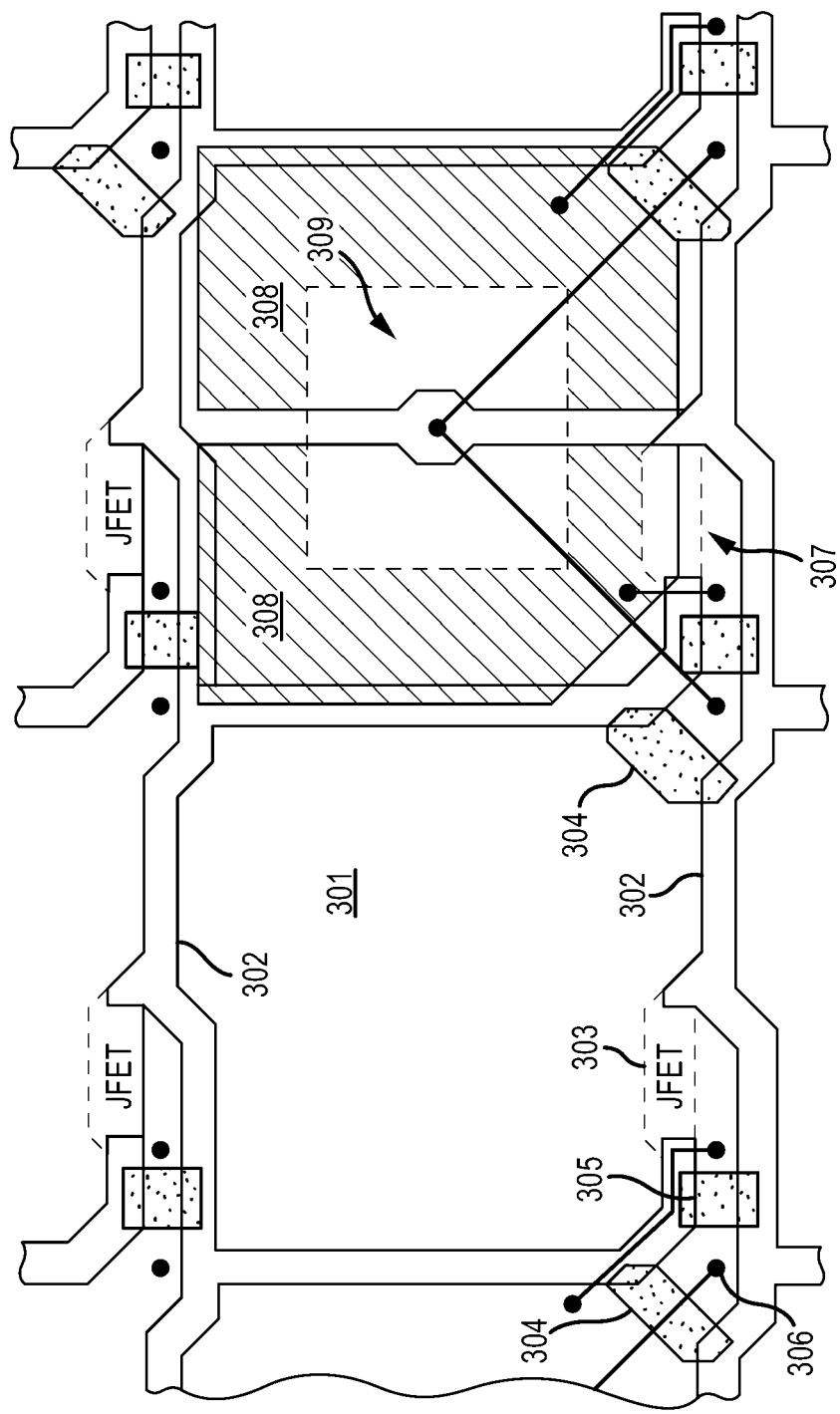
FIG. 4 is a top view of the illustrative imaging pixels of FIG. 3 that shows the locations of the charge overflow JFET transistors, charge transfer gates for sensing the low light level generated signals, transistor switches for sensing the high light level generated signals, and the location of the charge storage capacitors in accordance with an embodiment of the present invention.

For better clarity, a top view of the pixels in upper chip 42 of FIG. 3 is shown in FIG. 4. FIG. 4 shows the photodiode area 301 and pixel isolation regions 302. The pixel isolation regions 302 can be formed using any desired technique (e.g., implantation of p+ type doped implants, shallow trench isolation (STI), etc.). The overflow JFET transistor gate is the region 303 with its drain being the region 307. The charge transfer transistor gate (i.e., the gate of transistor 203 in FIG. 3) is the region 304 formed by an n+ type doped polysilicon layer and the FD region is the region 306 that is connected to the bump pad by a metal wiring (shown only schematically in this drawing). The charge overflow signal switching transistor gate (i.e., the gate of transistor 204 in FIG. 3) is the region 305 that is also an n+ type doped polysilicon. The overflow charge storage capacitors are the regions 308 connected to the regions 307. The bump contact metal pad (i.e., interconnect 212 in FIG. 3) is the region 309. Both the overflow charge capacitors and the bump pad are placed under the blue light sensing photodiode and also serve as reflectors of any residual Blue light that might possibly penetrate through this photodiode. This metal also shields the circuits placed in the circuit block under this pixel from a possible undesirable penetration of residual light. For simplicity of the drawing, the details of the metal wiring of pixels were omitted from the drawing and only the simple schematic line connections are indicated. Additionally, the contact via to polysilicon gates and the ground are also omitted from the drawing.

Figure 5:
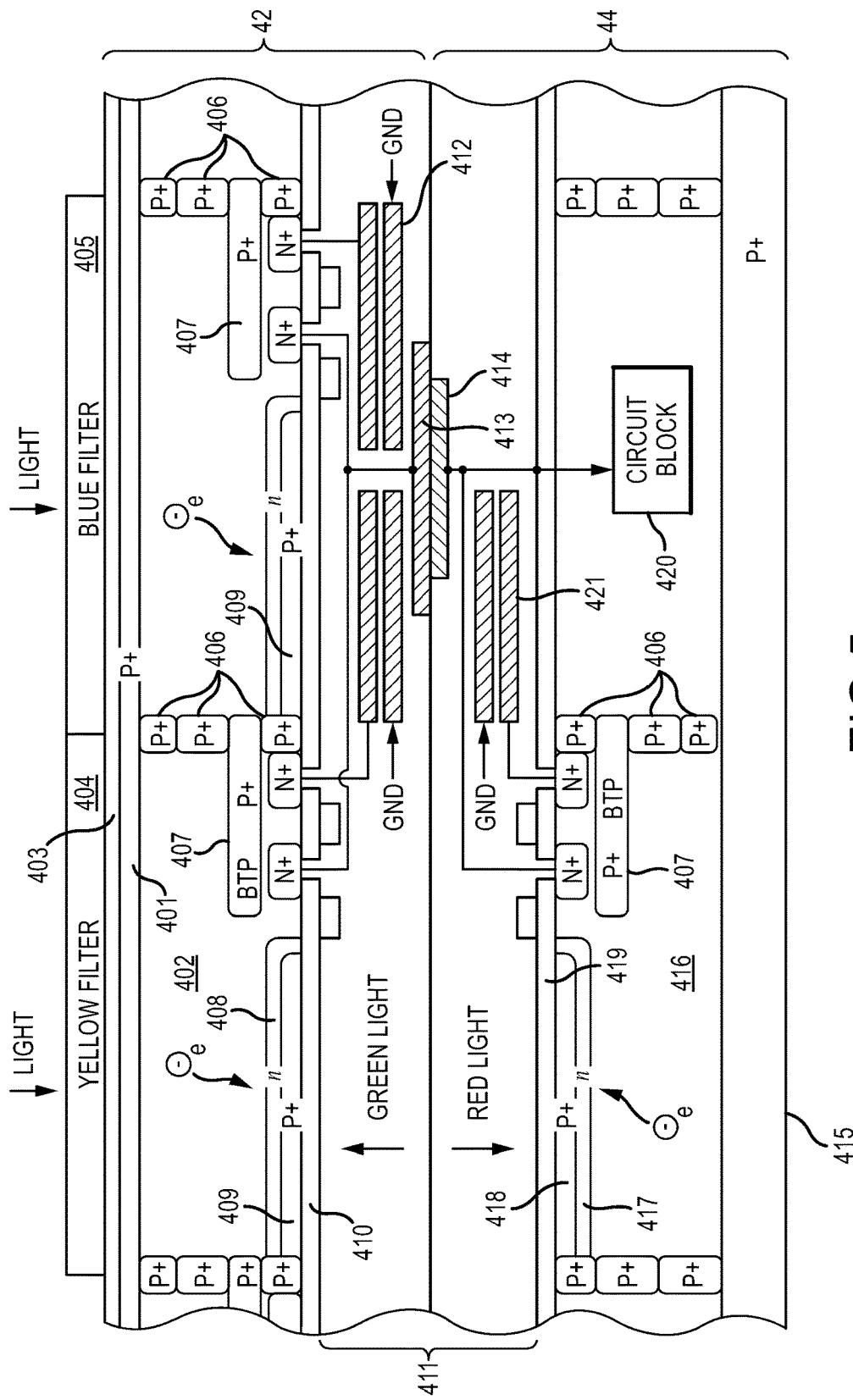
FIG. 5 is a cross-sectional side view of the illustrative imaging pixels of FIGS. 3 and 4 that shows the hybrid bonding arrangement, the location of the shared circuits under the blue light sensing photodiode, the metal plates forming the overflow charge storage capacitors, and the multilayer dielectric interference filter in accordance with an embodiment of the present invention.

FIG. 5 is a cross-sectional side view of the pixels shown in FIGS. 3 and 4. FIG. 5 shows back side illuminated upper chip 42 that includes p+ type doped layer 401 on its back surface with an epitaxial bulk region 402 deposited on it. The chip back side surface may also be covered by an oxide or other type of a dielectric layer such as hafnium dioxide 403. Layers 401 and 403 may both be used to minimize the interface generated dark current. Color filters 404 may be deposited over these layers. FIG. 5 shows a yellow color filter and a blue color filter. However, these examples are merely illustrative and color filters of any desired color may be used. There may also be micro-lenses placed on top of these filters if desired. The pixels may be isolated from each other by p+ type doped pixel isolation implants 406 and by the p+ type doped Bottom P+ (BTP) layer 407 that prevents the photon generated charge from escaping from the photodiodes to other n+ type doped regions in the sensor. The pinned photodiodes may be formed by regions 408 (n-type doped) and 409 (p+ type doped) on the top level chip and by the regions 417 (n-type doped) and 418 (p+ type doped) on the middle level chip. The transistor gates may be isolated from the substrates by oxide dielectric layers 410 and 419.

Middle chip 44 may include a p+ type doped substrate 415 and epitaxial bulk region 416. Photons may enter the middle chip photodiode through various metal wiring isolation layers forming the multilayer dielectric layer 411. Dielectric layer 411 may also serve as a dichroic color filter that reflects green light back to the upper chip 42 and passes red light to the middle chip 44. Generally, a dichroic filter may selectively pass a specific color of light while reflecting light of other colors. Accordingly, dichroic filter 411 may pass light of the type to be sensed by pixel 256 (i.e., red light or near infrared light) and reflect other types of light. This ensures that pixel 256 only senses light with the wavelength of interest and improves the efficiency of pixel 254.

Circuits may be placed in a block 420 under the blue light detecting photodiode. Circuit block 420 may include the source follower transistor shown in FIG. 3, the inverting amplifier shown in FIG. 3, and any other desired circuitry. Capacitor 421 is shown integrated into the dielectric layers of middle chip 44. The upper chip capacitors are the structures 412. The chip-to-chip bump connection (212) and the bump pads are the region 413 and 414.

Although not shown in the example of FIG. 5, it is possible to design the circuit block somewhat smaller than the pixel size to allow some margin for chip-to-chip misalignment tolerance.

Figure 6:
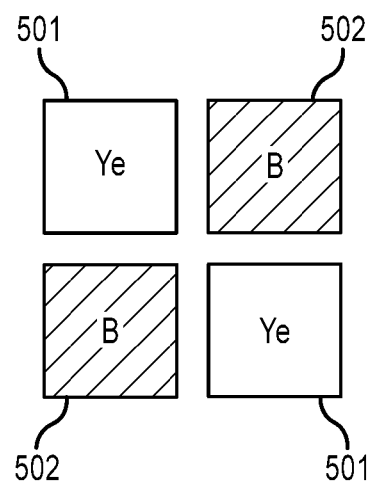
FIG. 6 is a top view of the illustrative imaging pixels of FIGS. 3-5 showing the checkerboard pixel arrangement of the pixels in accordance with an embodiment of the present invention.

FIG. 6 is a top view of an illustrative pixel group of the type shown in FIGS. 3-5. FIG. 6 illustrates the arrangement of pixels with blue color filters 502 and yellow color filters 501 in a checkerboard scheme. This arrangement provides for a simple color signal interpolation and processing and for the best color restoration with minimum noise and minimum undesirable Moiré artifact. As previously discussed, color filters with other desired colors may be used.

In various embodiments, high dynamic range rolling shutter pixels may be integrated in a stacked CMOS image sensor array with an upper chip, middle chip, and lower chip. The image sensor array may be illuminated from the back side of the substrate and a red light or near infrared light detecting photodiode may be placed on the middle chip below the photodiode of the upper chip. The upper chip and the middle chip may be separated from each other by a dichroic multilevel dielectric that reflects green light back to the photodiode in the upper chip and passes red light or near infrared light to the photodiode in the middle chip.

The foregoing is merely illustrative of the principles of this invention and various modifications can be made by those skilled in the art without departing from the scope and spirit of the invention.

What is claimed is:
1. An image sensor, comprising:
    a first substrate;
    a first photodiode, wherein the first photodiode is formed in the first substrate;
    a second photodiode, wherein the second photodiode is formed in the first substrate;
    a second substrate;
    a conductive interconnect layer that couples the first substrate to the second substrate, wherein the first and second photodiodes are both coupled to the conductive interconnect layer; and
    a third photodiode, wherein the third photodiode is formed in the second substrate and wherein the third photodiode is formed underneath the first photodiode.
2. The image sensor defined in claim 1, further comprising:
    a first transistor in the first substrate that is coupled between the first photodiode and the conductive interconnect layer; and
    a second transistor in the first substrate that is coupled between the second photodiode and the conductive interconnect layer.
3. The image sensor defined in claim 2, further comprising:
    signal sensing circuitry formed in the second substrate underneath the second photodiode.
4. The image sensor defined in claim 3, wherein the signal sensing circuitry comprises a source follower transistor.
5. The image sensor defined in claim 4, wherein the signal sensing circuitry comprises an inverting gain amplifier with capacitive feedback.
6. The image sensor defined in claim 5, wherein the inverting gain amplifier has an input node that is coupled to the conductive interconnect layer.
7. The image sensor defined in claim 6, further comprising:
    a first charge overflow transistor in the first substrate, wherein the first charge overflow transistor is coupled between the first photodiode and a first charge overflow capacitor; and a second charge overflow transistor in the first substrate, wherein the second charge overflow transistor is coupled between the second photodiode and a second charge overflow capacitor.

8. The image sensor defined in claim 7, wherein the first and second charge overflow capacitors are formed underneath the second photodiode and serve as reflectors to reflect incident light to the second photodiode.

9. The image sensor defined in claim 7, wherein the first and second charge overflow transistors are junction gate field-effect transistors that have predetermined voltage barriers.

10. The image sensor defined in claim 7, further comprising:
a third transistor in the first substrate that is coupled between the first charge overflow capacitor and the conductive interconnect layer; and
a fourth transistor in the first substrate that is coupled between the second charge overflow capacitor and the conductive interconnect layer.

11. The image sensor defined in claim 10, further comprising:
a fifth transistor in the second substrate that is coupled between the third photodiode and the input node of the inverting gain amplifier.

12. The image sensor defined in claim 11, further comprising:
a third charge overflow transistor in the second substrate, wherein the third charge overflow transistor is coupled between the third photodiode and a third charge overflow capacitor; and
a sixth transistor in the second substrate that is coupled between the third charge overflow capacitor and the source follower transistor.

13. The image sensor defined in claim 12, further comprising:
a broadband color filter of a first color formed over the first photodiode; and
a color filter of a second color formed over the second photodiode, wherein the first color is different than the second color.

14. The image sensor defined in claim 13, further comprising:
a dichroic filter between the first photodiode and the third photodiode that is configured to pass light of only a third color to the third photodiode, wherein the third color is different than the first and second colors.

15. The image sensor defined in claim 14, wherein the first color is yellow, wherein the second color is blue, and wherein the third color is red.

16. The image sensor defined in claim 14, wherein the first color is clear and wherein the third color is selected from the group consisting of: red and near infrared.

17. An image sensor, comprising:
a first substrate;
a first plurality of photodiodes, wherein the first plurality of photodiodes is formed in the first substrate;
a first plurality of color filter elements formed over the first plurality of photodiodes, wherein the first plurality of color filter elements are broadband color filter elements;
a second plurality of photodiodes, wherein the second plurality of photodiodes is formed in the first substrate and wherein the first and second pluralities of photodiodes are arranged in a checkerboard pattern;
a second plurality of color filter elements formed over the second plurality of photodiodes;
a second substrate; and
a third plurality of photodiodes, wherein the third plurality of photodiodes is formed in the second substrate and wherein each photodiode in the third plurality of photodiodes is formed underneath a photodiode of the first plurality of photodiodes.

18. The image sensor defined in claim 17, further comprising:
a plurality of circuit blocks formed in the second substrate, wherein each circuit block is formed underneath a photodiode of the second plurality of photodiodes and wherein each circuit block is configured to read out charge levels from one photodiode of the first plurality of photodiodes, one photodiode of the second plurality of photodiodes, and one photodiode of the third plurality of photodiodes.

19. An image sensor with at least first and second chips, wherein the image sensor comprises a plurality of 1×2 pixel groups arranged in a repeating pattern, each pixel group comprising:
a first photodiode in the first chip;
a broadband color filter formed over the first photodiode;
a second photodiode in the first chip;
a blue color filter formed over the second photodiode;
a third photodiode in the second chip, wherein the third photodiode is formed underneath the first photodiode; and
signal sensor circuitry in the second chip, wherein the signal sensor circuitry is formed underneath the second photodiode.

20. The image sensor defined in claim 19, wherein the broadband color filter is a color filter selected from the group consisting of: a yellow color filter and a clear color filter.

21. The image sensor defined in claim 1, wherein the conductive interconnect layer is formed from metal.

* * * * *